United States Patent [19]
Kane

[11] Patent Number: 6,045,385
[45] Date of Patent: Apr. 4, 2000

[54] RETENTION GUIDES FOR PROCESSOR MODULE

[75] Inventor: Vincent Michael Kane, Harrisburg, Pa.

[73] Assignee: The Whitaker Corporation, Wilmington, Del.

[21] Appl. No.: 09/066,251

[22] Filed: Apr. 24, 1998

[51] Int. Cl.[7] .................................................. H01R 13/62
[52] U.S. Cl. .......................................... 439/327; 439/372
[58] Field of Search .................................... 439/326–329, 439/152–160

[56] References Cited

U.S. PATENT DOCUMENTS

| | | | |
|---|---|---|---|
| 3,829,741 | 8/1974 | Athey | 317/101 DH |
| 4,070,081 | 1/1978 | Takahashi | 339/91 |
| 4,178,051 | 12/1979 | Kocher et al. | 339/45 |
| 4,241,966 | 12/1980 | Gomez | 339/45 |
| 4,349,237 | 9/1982 | Cobaugh et al. | 339/65 |
| 4,579,411 | 4/1986 | Cobaugh et al. | 439/327 |
| 4,648,009 | 3/1987 | Beun et al. | 361/399 |
| 4,712,848 | 12/1987 | Edgley | 439/327 |
| 4,761,141 | 8/1988 | Hawk et al. | 439/153 |
| 4,858,309 | 8/1989 | Korsunsky et al. | 29/764 |
| 4,872,853 | 10/1989 | Webster | 439/327 |
| 5,162,979 | 11/1992 | Anzelone et al. | 361/415 |
| 5,267,872 | 12/1993 | Gou et al. | 439/326 |
| 5,302,133 | 4/1994 | Tondreault | 439/328 |
| 5,417,580 | 5/1995 | Tsai | 439/328 |
| 5,573,408 | 11/1996 | Laub et al. | 439/62 |
| 5,637,004 | 6/1997 | Chen et al. | 439/328 |
| 5,649,831 | 7/1997 | Townsend | 439/157 |
| 5,726,865 | 3/1998 | Webb et al. | 361/801 |
| 5,730,611 | 3/1998 | Cheng et al. | 439/160 |
| 5,762,513 | 6/1998 | Stine | 439/358 |
| 5,842,880 | 12/1998 | Pei | 439/327 |

OTHER PUBLICATIONS

U.S. Serial No. 09/063,127 filed Apr. 20, 1998 (Abstract and Drawings only).
U.S. Serial No. 09/062,535 filed Apr. 17, 1998 (Abstract and Drawings only).

*Primary Examiner*—Hien Vu

[57] ABSTRACT

Assembly (10) includes at least one pair of retention members (12) at ends of a board-mounted receptacle connector and defines guide channels (26) for insertion thereinto of a module (20) or card (18). A latching member (50) is pivotably mounted to each retention member (12) to be pivoted into latching engagement with a recess (38,40) of the module or card. A detent is defined by a stop embossment (70) such that an actuator arm (56) of the latching member latches therebeneath to prevent counterrotation of the latching member after latching, to assure maintenance of the latched condition.

7 Claims, 5 Drawing Sheets

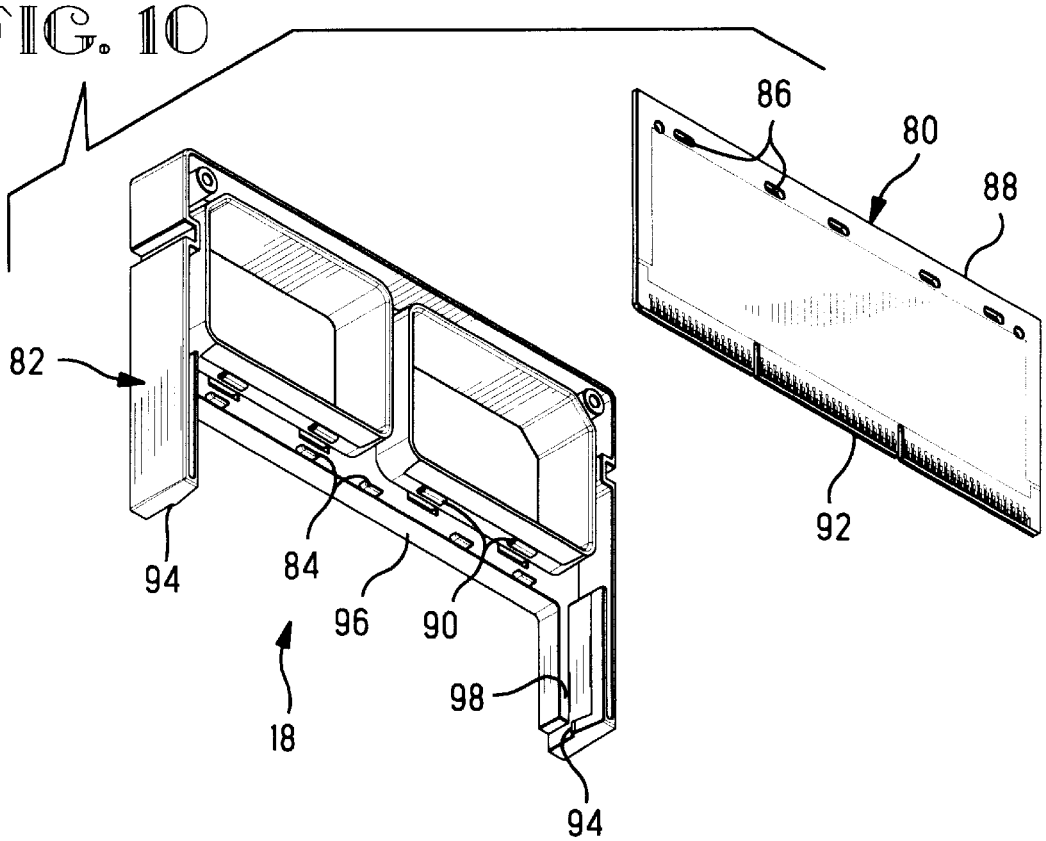

RETENTION GUIDES FOR PROCESSOR MODULE

FIELD OF THE INVENTION

This relates to the field of electrical connectors and more particularly to components mountable to a circuit board.

BACKGROUND OF THE INVENTION

In computers and other electronic equipment, circuit boards are utilized to which are mounted numerous electrical and electronic components. Smaller circuit cards are utilized to establish electrical connections to a larger circuit board in a manner that permits removal and disconnection, by inserting an edge of the card into a receptacle connector mounted on the board and containing an array of contacts connected to circuits of the board; contact sections of the contacts are exposed within a card-receiving cavity of the connector that engage circuit pads on the card surfaces upon card insertion. It has become useful to secure certain cards within larger modules so that components mounted on the card are protected by the module covers during handling. Such modules need to be accurately guided during mating with the receptacle connector so that the leading end of the enclosed card is accurately received into the card-receiving cavity of the connector, since the module covers inhibit accurate visual alignment of the card with the cavity. It is known to provide elongate guide members projecting from the board from ends of receptacle connectors to facilitate mating in similar situations. Such elongate guide members may be mounted on the circuit board substantially prior to their actual use during module mating.

It is desired to provide a system for guiding the module during mating with the receptacle connector. It is also desired to provide module guides that maintain a low profile prior to module mating.

In U.S. patent application Ser. No. (Whitaker Case No. 16929) filed Apr. 20, 1998 and assigned to the assignee hereof, is disclosed an assembly that includes a frame mountable on the circuit board surrounding the receptacle connector or optionally as an integral portion of the connector housing. At opposed ends of the frame are mounted respective guide members containing inwardly facing channels precisely aligned with the card-receiving cavity of the connector. The guide members are pivotably secured to the frame, so that the members may be pivoted to a recumbent orientation parallel to the circuit board when a module is not mated to the connector, and be pivoted to an erect position for use.

It is desired to provide latches on retention guides that are manually actuatable and accommodate a range of insertion depths of a module or terminator card.

SUMMARY OF THE INVENTION

Guide or retention members of the assembly are pivotably mountable to respective end blocks at ends of a receptacle connector, or to integral end sections of a frame surrounding the periphery of the connector. Each retention member includes a latch member movably affixed thereto that is actuatable to become latched to a module inserted between a pair of retention members and fully mated with the receptacle connector. The latch member is pivotably mounted and includes manually engageable actuation sections, and the retention member provides a stop section to hold the latch member in the latched position. Preferably the latch member is so mounted that it does not obstruct insertion of a module.

An embodiment of the present invention will now be described by way of example with reference to the accompanying drawings.

BRIEF DESCRIPTION OF THE DRAWINGS

FIG. 10 is an isometric view of a terminator card of FIGS. 1 and 2 exploded from its frame.

DETAILED DESCRIPTION

Figure 1:
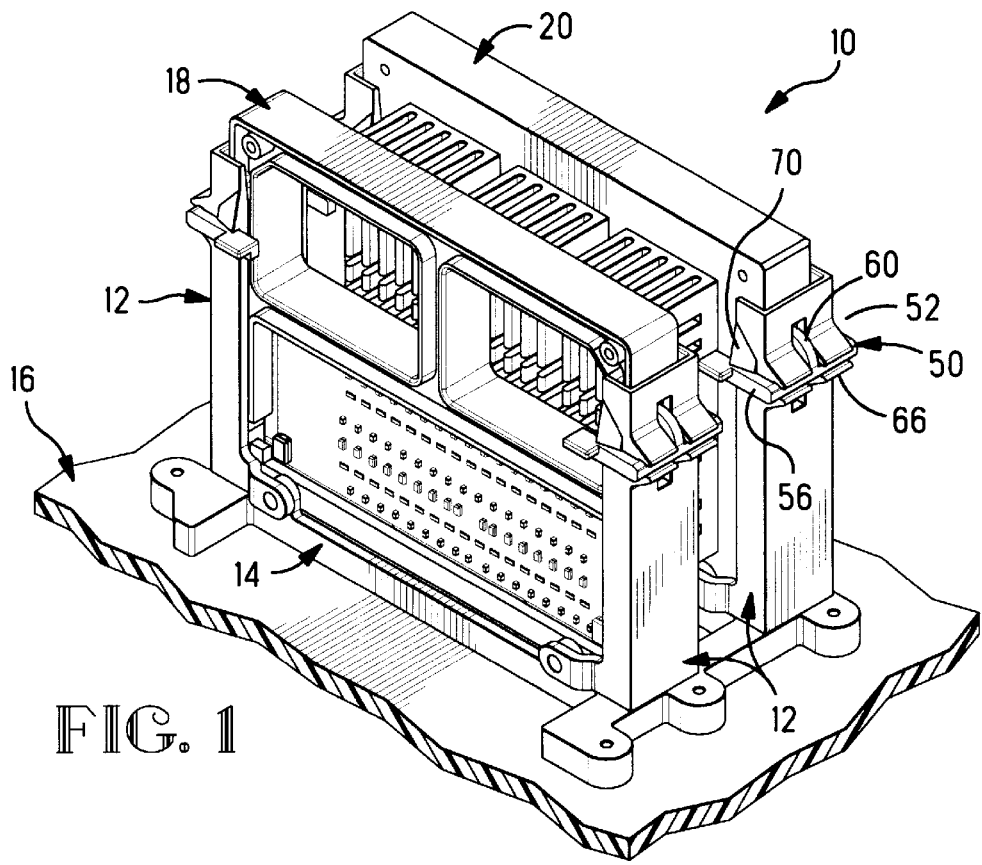
FIG. 1 is an isometric view of an assembly including pairs of retention members mounted to a frame, with a terminator card assembly latched in position by one pair and a processor module latched in position by the second pair.
Figure 2:
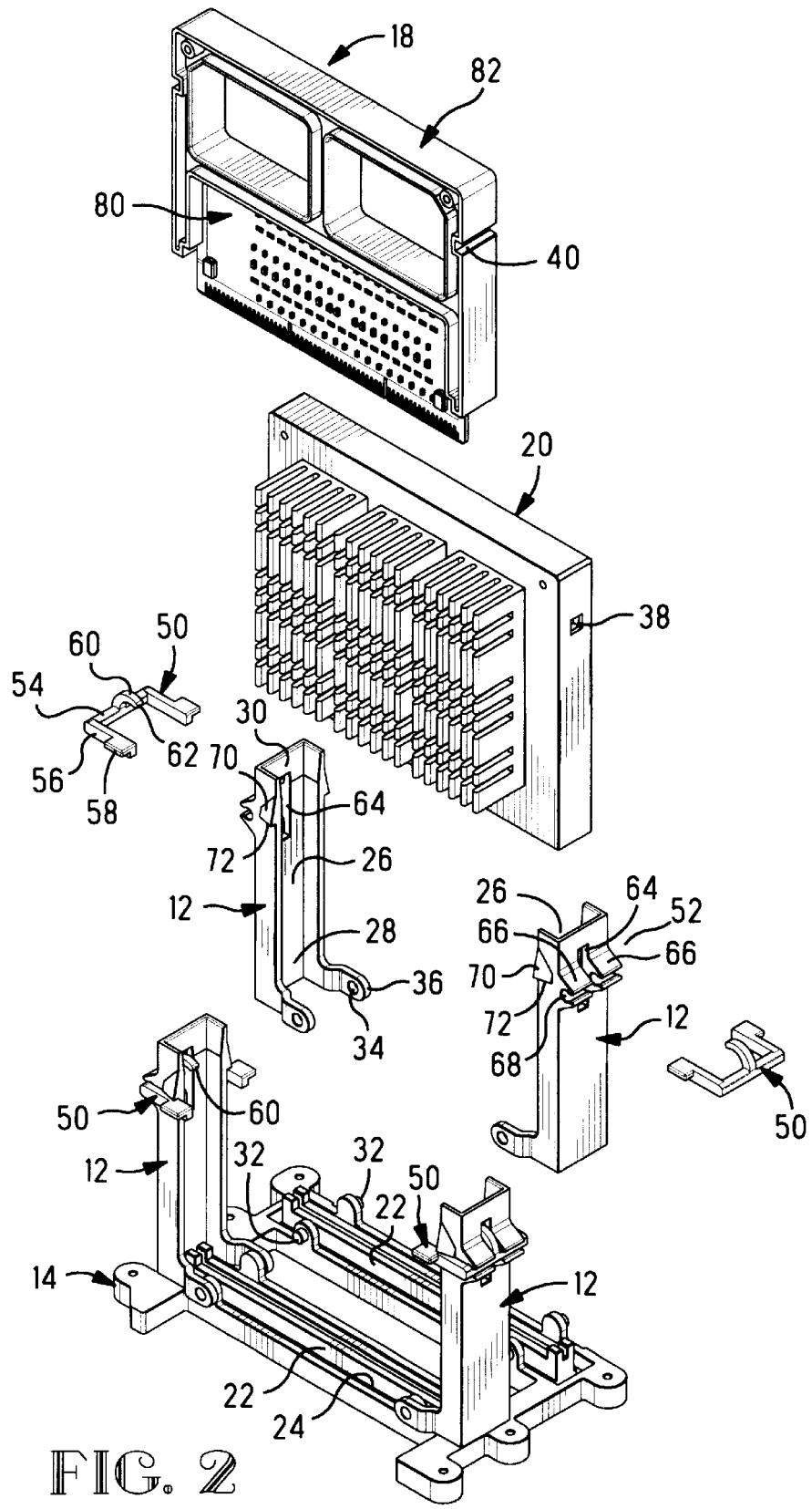
FIG. 2 is an isometric view with the module and terminator card and its frame exploded from the assembly, and with the latch members exploded from the retention members.

Assembly 10 of FIGS. 1 and 2 is shown to include two pairs of opposed pivotable retention members 12 pivotably affixed to a common frame 14 to define two positions, mounted to a circuit board 16. A terminator card assembly 18 is shown in a first position and a processor module 20 in the second position, both being latched in a mated position with respect to respective receptacle connectors 22 in respective recesses 24 at the bases of the pairs of retention members.

Each retention member 12 defines a guide channel 26 for a respective side portion of either module 20 or terminator card assembly 18, for guidance to mate with a receptacle connector 22. Each guide channel extends upwardly from a base 28 of the retention member at an end of a receptacle connector 22, to an entrance 30 to receive thereinto the module side portion.

Figure 3:
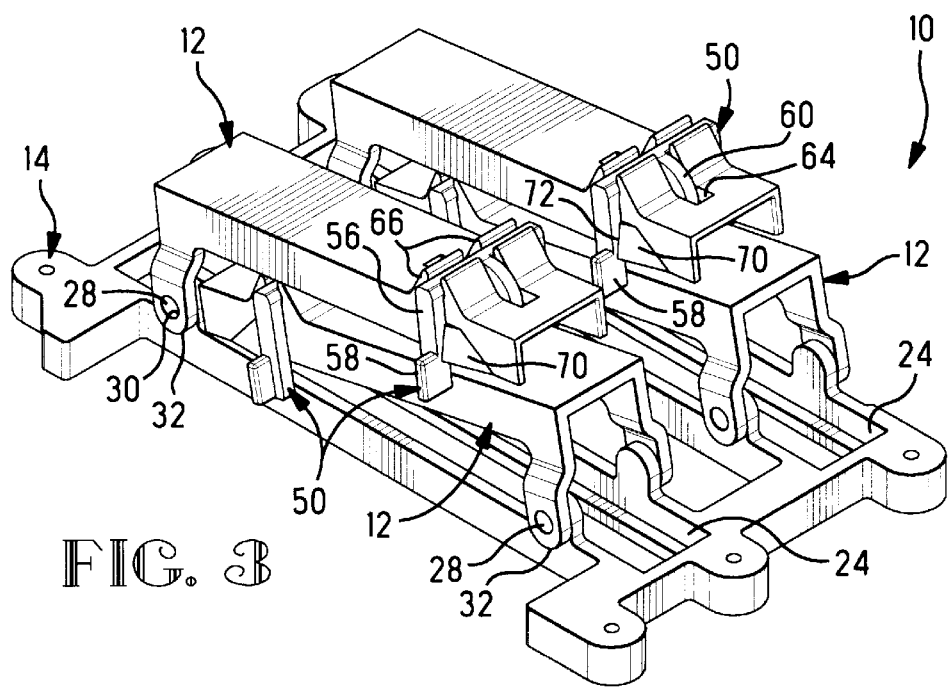
FIG. 3 is an isometric view of the frame of FIGS. 1 and 2 with the retention members pivoted to recumbent positions when not in use.

As shown in FIG. 3, each retention member 12 is pivotable with respect to frame 14 in order to be rotated to a recumbent position when no modules or terminator cards have been inserted. Pairs of cylindrical embossments 32 in FIG. 2 of frame 14 protrude outwardly through apertures 34 of respective retention member tabs 36 to define the pivot joint.

Referring to FIG. 2, each retention member 12 includes a latching member 50 attached thereto at a latching site 52 in FIG. 1 in a manner permitting pivoting thereof to become latched to either the processor module or the terminator card assembly. Each latching member 50 includes a transverse body section 54 of somewhat rounded cross-section (see FIG. 5) having actuator arms 56 coextending from opposed ends thereof to respective free ends 58 adapted to be manually engaged to pivot the latching member. An arcuate latch projection 60 projects from approximately the center of body section 54 to a free end 62 that will seat in a corresponding latching recess 38 of processor module 20 or latching recess 40 of terminator card assembly 18, when latching member 50 is actuated to be rotated into a latching position. Upon actuation, latch projection 60 extends through a window 64 in the retention member to project into the guide channel 26 to cooperate with either recess 38,40.

Each latching site 52 in FIG. 1 includes a pair of embossments 66 projecting outwardly from an outer surface of the retention member beside window 64 and include coaligned slots 68 that define bearing surfaces to cooperate with transverse body section 54 of latching member 50, as best seen in FIGS. 5 through 9. Transverse body section 54 is snapped into slots 68 that are slightly undercut with entrances narrower than the diameter of body section 54. Upon latching member 50 being assembled into position, actuator arms 56 extend along opposite sides of retention member 12. During latching, as actuator arms 56 are rotated along the sides of retention member 12, latching projection 60 enters window 64 and free end 62 enters a recess 38,40 to latch.

Preferably the latching system of the present invention also includes a detent: at least one of the actuator arms 56 will ride over a stop embossment 70 and latch beneath stop surface 72 thereof, as the latching projection 60 latches the module 20 or terminator card assembly 18. Stop surface 72 assures that latching member 50 will not pivot in a reverse direction, and that the latching member will not inadvertently delatch from the module or terminator card assembly. Stop embossment 70 is angled outwardly extending downwardly from the side of retention member 12 at a shallow angle, such as about 11 to 12 degrees, and chanted slightly forwardly, to permit gradual deflection of actuator arm 56 outwardly until latching occurs, as actuator arms 56 snap into position beneath stop surface 72. For delatching, actuator arms 56 are manually deflected outwardly as the arms are urged upwardly thereby pivoting the latching member, the arms thus being lifted over the stop embossment, until latching projection 60 is withdrawn from recess 38 or 40.

Figure 8:
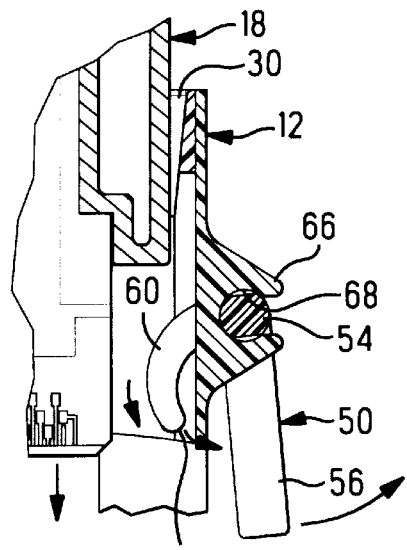
FIGS. 8 and 9 are section views illustrating insertion of a module showing the latching member being automatically pivoted to a clearance position.
Figure 9:
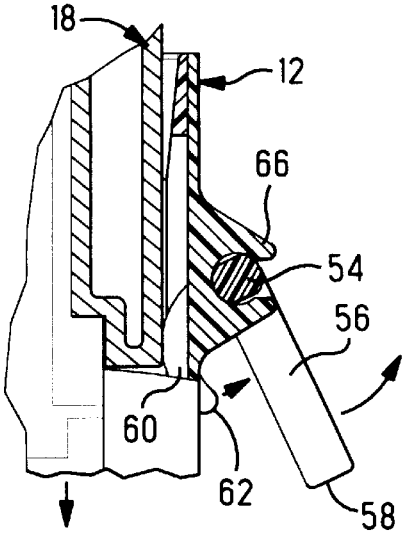
Figure 6:
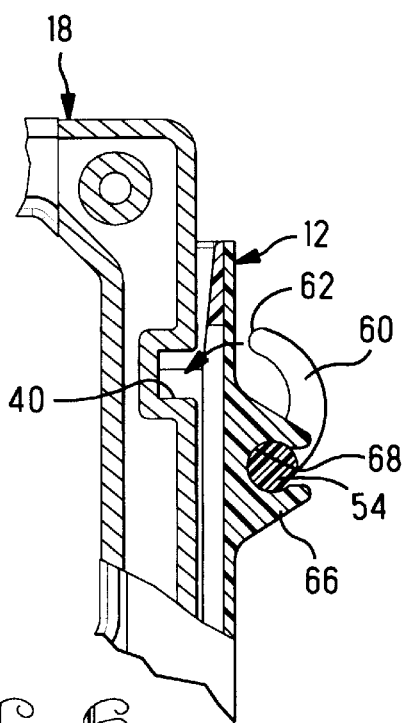
FIGS. 6 and 7 are section views illustrating a module and a retention member before latching and after latching, respectively.
Figure 7:
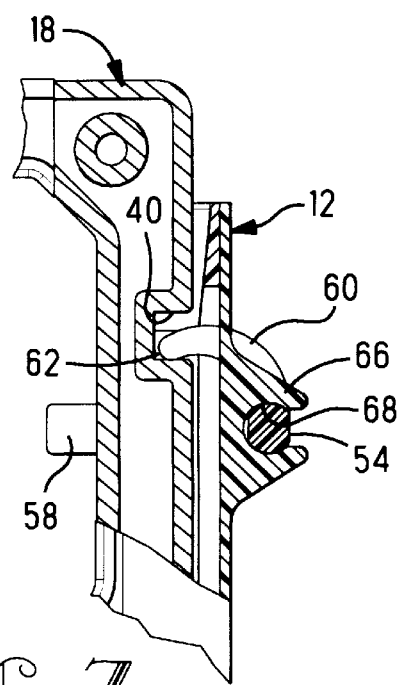

As seen in FIGS. 6 to 9, latching member 50 is freely pivotable, with transverse body section 54 rotatable in slots 68. Actuator arms 56 are movable with 360 degree motion as shown by the various positions of the latch projection 60 in FIGS. with respect to retention members 12, and window 64 is dimensioned to provide clearance for latching projection 60 as latching member 50 is rotated. In FIGS. 6 and 7, latching member 50 is pivoted to move latching projection 60 into latching condition with recess 40 of terminator card assembly 18. In FIGS. 8 and 9, one advantage of the latching arrangement of the present invention is demonstrated: if the latching member 50 is out of position before a terminator card assembly 18 or processor module 20 is inserted, and latching projection 60 extends into guide channel 26, the leading end of the card assembly 18 or module 20 bears against it thereby pivoting the latching member 50 until latching projection 60 has been moved through window 64 to clear the guide channel 26; the latching member 50 is self-adjusting upon being abutted by the module 20 or card assembly 18 leading end. Thereafter, the actuator arms 56 can be moved to pivot the latching member 50 into latched condition with respect to the fully inserted card assembly 18 or processor module 20.

A terminator card assembly 18, as seen in FIG. 10, includes a terminator card 80 and frame 82. The terminator card is easily assembled to the frame, with embossments 84 entering apertures 86 when trailing end 88 is placed behind ledges 90 and the card is rotated, and with side portions of the card adjacent leading edge 92 snapping behind stops 94 as card 80 is fully pivoted into nest 96 against back wall 98. As is shown, frame 82 includes large apertures above card 80 facilitating manual gripping for ease of manipulation of the assembly 18.

Figure 4:
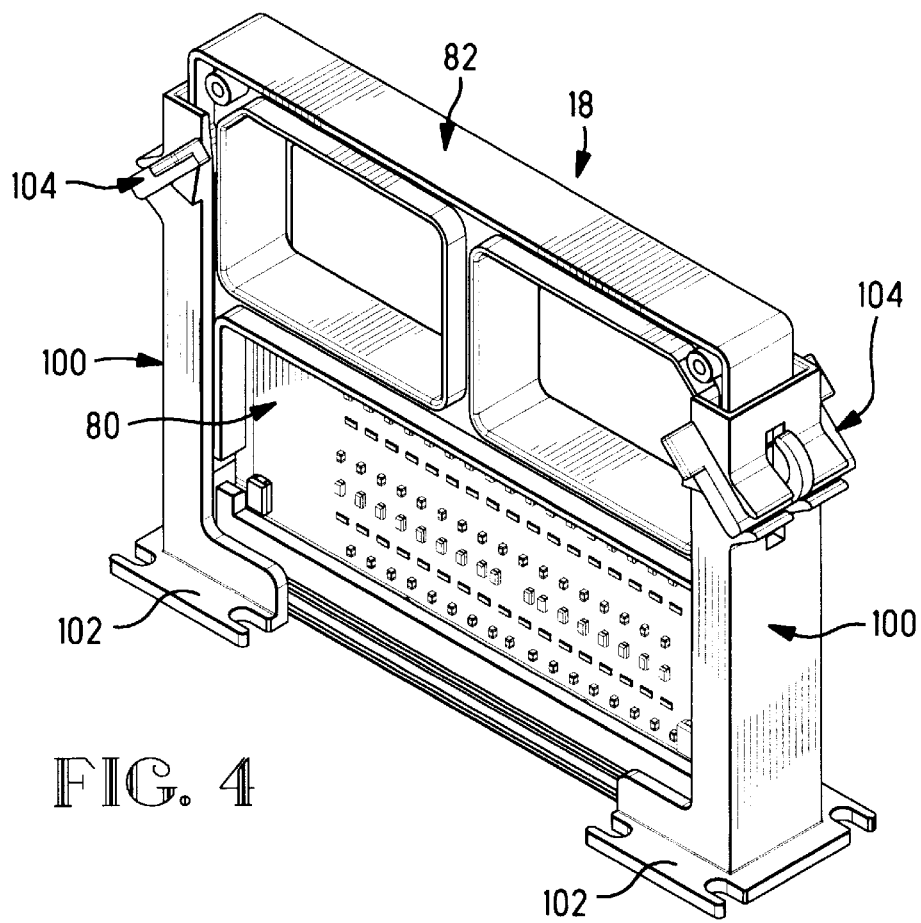
FIG. 4 is an isometric view of the terminator card assembly positioned in a pair of integral retention member end blocks mountable at ends of a receptacle connector.
Figure 5:
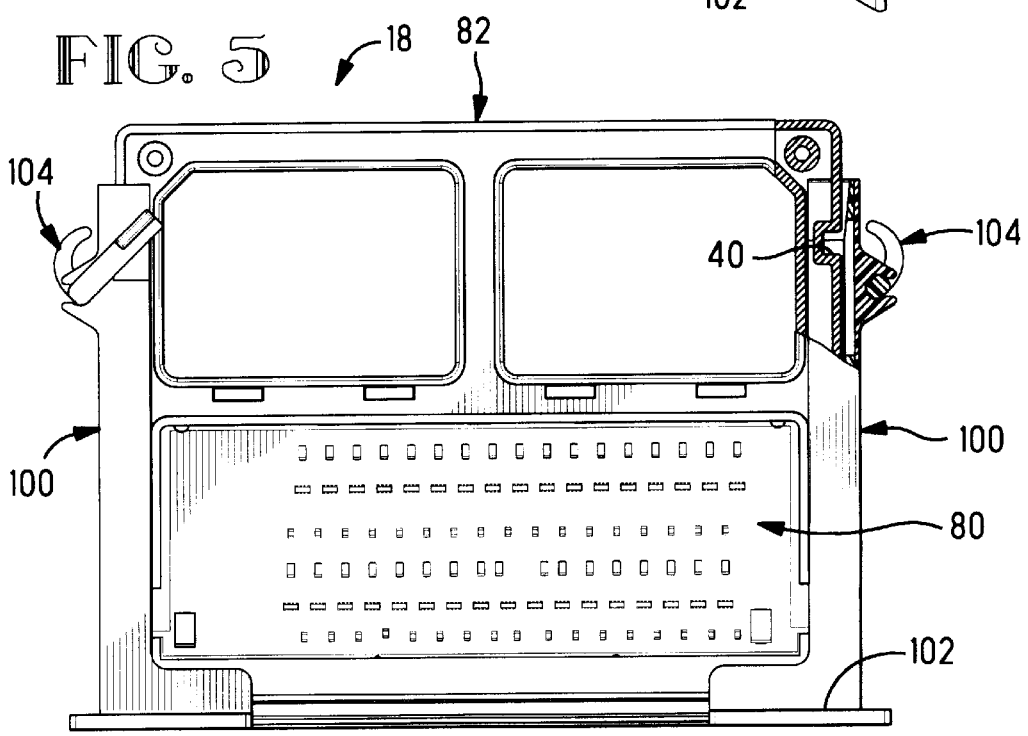
FIG. 5 is an elevation view of the assembly of FIG. 4 partly in section to illustrate a latching member positioned to become latched to the terminator card assembly.

In FIGS. 4 and 5, a terminator card assembly 18 is shown inserted along guide channels 26 of a pair of retention members 100 that comprise end blocks that are positioned at ends of a receptacle connector and have flanges 102 for being mounted to a circuit board. Retention members 100 have latching members 104 similar to those of FIGS. 1 to 4, and are similarly operable.

Variations and modifications can occur to the specific embodiment herein disclosed that are within the spirit of the invention and the scope of the claims. For example, the latching projection could be more of a straight cantilever beam with enhanced but limited deflection to accommodate variations in the height of the corresponding recess of the processor module or terminator card assembly. Also, the stop embossment could be defined on cantilever beam that permits manual deflection thereof to permit counterrotation of the actuator arms during intentional delatching of the latching member. The latching member could be molded of plastic material, or it could be fabricated of metal.

What is claimed is:

1. A latching system for latching an electrical module or card in mated relationship with a board-mounted electrical connector, comprising: a pair of retention members mounted at ends of said connector and defining guide channels extending upwardly from bases to entrances adjacent said connector ends to receive thereinto and therealong side portions of said electrical module or card, and a latching member mounted to a body section of each said retention member proximate said guide channel entrance thereof, said latching member including a latching projection, and said latching member being mounted to said retention member in a manner permitting pivoting thereof to move said latching projection into said guide channel to enter latching engagement with a cooperating latching section of said electrical module or card, said latching member including a transverse body section seated in a cooperating slot of said retention member and being pivotally movable in said slot, said retention member including a window through which said latching projection extends for a leading end thereof to enter in said guide channel to latch with said electrical module or card, and said latching member including a pair of actuator arms that extend from opposed ends of said transverse body section.

2. A latching system as set forth in claim 1 wherein said latching member includes an actuator section.

3. A latching system as set forth in claim 1 wherein said slot is defined in a pair of embossments extending from an outer surface of said retention member.

4. A latching system as set forth in claim 1 wherein said actuator arms extend along side surfaces of said retention member and at least one thereof rides over a stop embossment projecting from a said side surface and seats beneath a stop surface thereof, when said latching member has been pivoted into a latched condition with respect to said electrical article, and said stop surface prevents opposite movement and maintains the latched condition.

5. A latching system comprising:
   a retention member having a guide channel for receiving and guiding a moveable electrical article, such as, a card assembly, or such as, a processor module;
   a pivoting latching member pivotally mounted on the retention member;

the pivoting latching member having a latch projection to engage in a latching recess in the electrical article, and to retain the electrical article in the guide channel, the guide channel having a window;

the latch projection extending in the window in the guide channel prior to the electrical article being received in the guide channel;

the electrical article being received in the guide channel to engage the latch projection and pivot the latch projection out of the window, and pivot the latching member;

the latching member having at least one actuator arm to be gripped when manually pivoting the latching member to a latching position, and the latching member being manually pivotable to said latching position and to pivot the latch projection into latched engagement with the latching recess in the electrical article that has moved to a desired position in the guide channel.

6. A latching system as recited in claim 5 wherein, the latch projection and the actuator arm extend from a transverse body section on the latch arm, and the transverse body section is pivotably attached to the retention member by being pivotable in and held in a slot in the retention member.

7. A latching system as recited in claim 5 wherein, the retention member has a projecting stop embossment, the actuator arm being manually pivotable to a latching position that corresponds with the latch projection being in latched engagement with the latching recess in the electrical article, and the actuator arm riding over the stop embossment to be held by the stop embossment in said latching position.

* * * * *